United States Patent
Tai et al.

(10) Patent No.: US 7,875,541 B2
(45) Date of Patent: Jan. 25, 2011

(54) SHALLOW SOURCE MOSFET

(75) Inventors: Sung-Shan Tai, San Jose, CA (US); Tiesheng Li, San Jose, CA (US); Anup Bhalla, Santa Clara, CA (US); Hong Chang, Cupertino, CA (US); Moses Ho, Campbell, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 12/655,162

(22) Filed: Dec. 22, 2009

(65) Prior Publication Data

US 2010/0105182 A1    Apr. 29, 2010

Related U.S. Application Data

(62) Division of application No. 10/952,231, filed on Sep. 27, 2004, now Pat. No. 7,667,264.

(51) Int. Cl.
*H01L 21/3205* (2006.01)
(52) U.S. Cl. ................. 438/589; 438/259; 438/270; 438/585; 438/595; 257/330; 257/E29.257; 257/E21.626; 257/E21.64
(58) Field of Classification Search ......... 257/329–331, 257/E29.257, E29.26, E21.626, E21.64; 438/259, 438/270, 585, 589, 595
See application file for complete search history.

(56) References Cited

U.S. PATENT DOCUMENTS

| 6,858,896 B2 * | 2/2005 | Inagawa et al. ............. 257/332 |
| 6,982,202 B2 * | 1/2006 | Hofmann et al. ............ 438/259 |
| 2004/0195608 A1 | 10/2004 | Kim et al. |

* cited by examiner

*Primary Examiner*—Matthew E Warren
(74) *Attorney, Agent, or Firm*—Van Pelt, Yi & James LLP

(57) ABSTRACT

Fabricating a semiconductor device includes forming a hard mask on a substrate having a top substrate surface, forming a trench in the substrate through the hard mask, depositing gate material in the trench, where the amount of gate material deposited in the trench extends beyond the top substrate surface, and removing the hard mask to leave a gate having a gate top surface that extends substantially above the top substrate surface at least in center region of the trench opening, the gate having a vertical edge that includes an extended portion, the extended portion extending above the trench opening and being substantially aligned with the trench wall. It further includes implanting a body, implanting a plurality of source regions embedded in the body, forming a plurality of spacers that insulate the source regions from the gate, the plurality of spacers being situated immediately adjacent to the gate and immediately adjacent to respective ones of the plurality of source regions, wherein the plurality of spacers do not substantially extend into the trench and do not substantially extend over the trench, disposing a dielectric layer over the source, the spacers, the gate, and at least a portion of the body, forming a contact opening, and disposing metal to form a contact with the body at the contact opening.

10 Claims, 8 Drawing Sheets

SHALLOW SOURCE MOSFET

CROSS REFERENCE TO OTHER APPLICATIONS

This application is a divisional of U.S. patent application Ser. No. 10/952,231, entitled SHALLOW SOURCE MOSFET, filed Sep. 27, 2004 now U.S. Pat. No. 7,667,264, which is incorporated herein by reference for all purposes

FIELD OF THE INVENTION

The present invention relates generally to semiconductor devices. More specifically, a Metal Oxide Semiconductor Field Effect Transistor (MOSFET) device is disclosed.

BACKGROUND OF THE INVENTION

A trench power metal oxide semiconductor device is a common type of semiconductor device. FIG. 1 is a diagram illustrating the cross-section of a typical power MOSFET device. In this example, device 100 includes a source 104 made of $N^+$-type material, a body 106 made of P-type material and a drain 108 made of N-type material. Device 100 also includes a gate 102 that is recessed from the top surface of source 104 and body 106. The recessed gate is typically a result of the fabrication steps used to produce the transistor.

While this type of MOSFET device with recessed gate has proven useful, several problems remain. One of the problems associated with the current device structure is the on state resistance. Since the bottom portion of source region 104 is typically required to overlap with recessed gate 102 to insure proper device operation, the depth of source region 104 typically needs to meet a certain minimum. The current, which flows through the source region at a minimal required depth, leads to an on state resistance having a minimum value that is not easily reduced.

Another problem associated with the typical source depth requirement is gate capacitance. Since the channel typically requires a minimal channel length, a deeper source means that a deeper trench is typically required to accommodate the gate, thus increasing the gate capacitance and lowering the switching speed. The lateral diffusion of a deeper source typically requires a larger contact. As such, the reduction in device size and the increase in cell density are both limited.

Another problem associated with the current design is that the parasitic bipolar NPN transistor formed by source 104, body 106 and drain 108 is often easily turned on, thus limiting the operable range of the device. FIG. 2 is a diagram illustrating a circuit model of a MOSFET device similar to the one shown in FIG. 1. Bipolar transistor 202 is a parasitic transistor formed between the source and the drain. With a thick source region, the distance between the body contact and the channel region is high, so is the resistance between the base-emitter terminals (resistor 204). As a result, a small amount of leaked current flowing through the bipolar transistor may lead to a voltage drop between the base and the emitter that exceeds the threshold required for turning on the bipolar transistor.

It would be desirable to develop a MOSFET device with shallower source to improve cell density and to reduce on state resistance. It would also be useful if the resistance between the base and emitter of the parasitic bipolar transistor could be reduced so that the parasitic bipolar transistor would not be turned on easily. It would also be useful to develop a power MOSFET device with shallower trench depth and smaller gate capacitance to improve the device switching speed.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A semiconductor device and its associated fabrication process are disclosed. The semiconductor device comprises a drain, a body in contact with the drain, a source embedded in the body, extending downward from the top surface of the body into the body, a trench extending through the source and the body to the drain, a gate disposed in the trench that has a gate top surface extending substantially above the source top surface, and a gate oxide insulating the gate from the source, the body and the drain. For the purpose of illustration, examples of MOSFET devices are discussed in detail throughout this specification. The techniques are also applicable to other device types such as Insulated Gate Bipolar Transistors (IGBTs) and MOS-Controlled Thyristors (MCTs).

Figure 1:
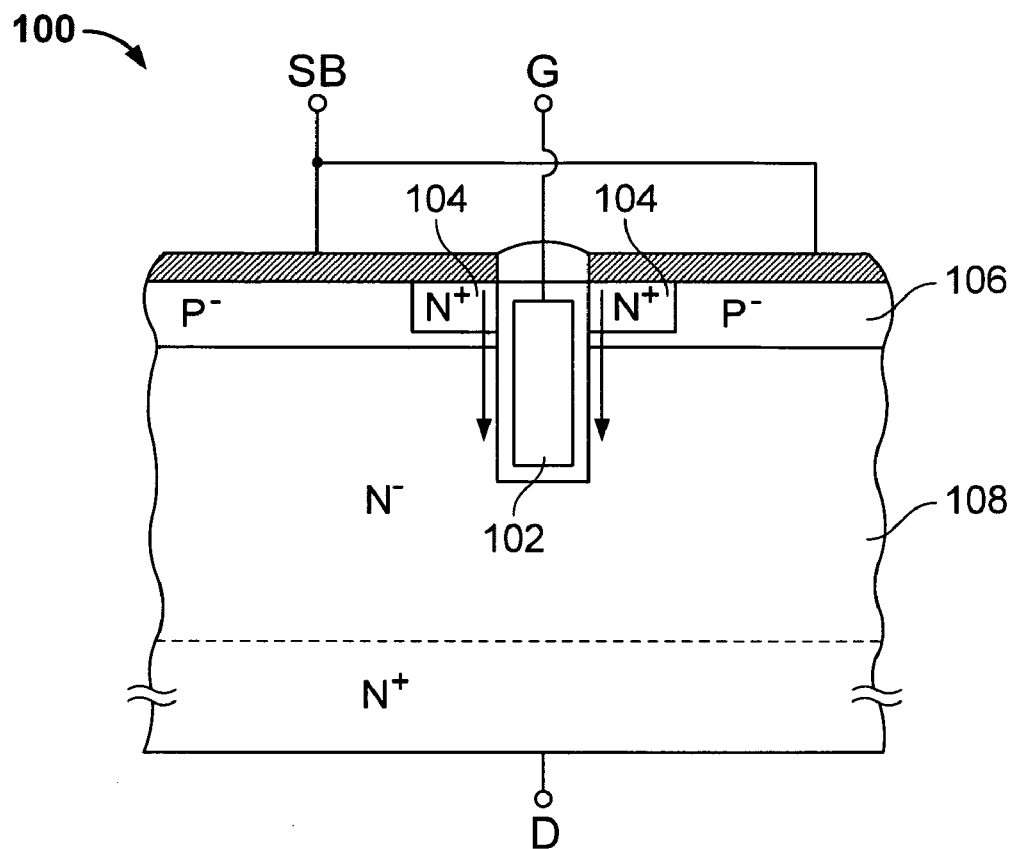
FIG. 1 is a diagram illustrating the cross-section of a typical power MOSFET device.
Figure 2:
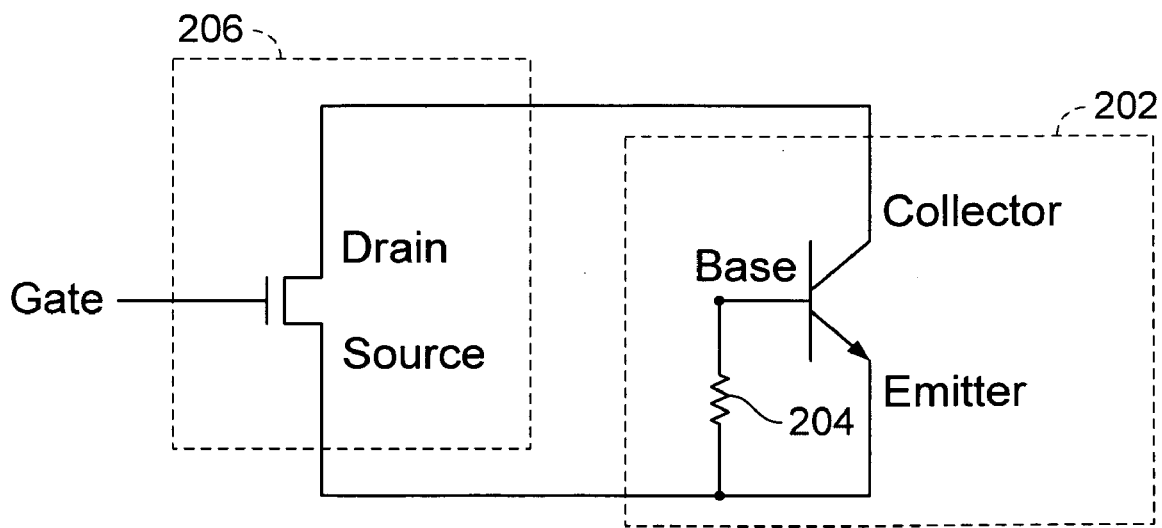
FIG. 2 is a diagram illustrating a circuit model of a MOSFET device similar to the one shown in FIG. 1.
Figure 3:
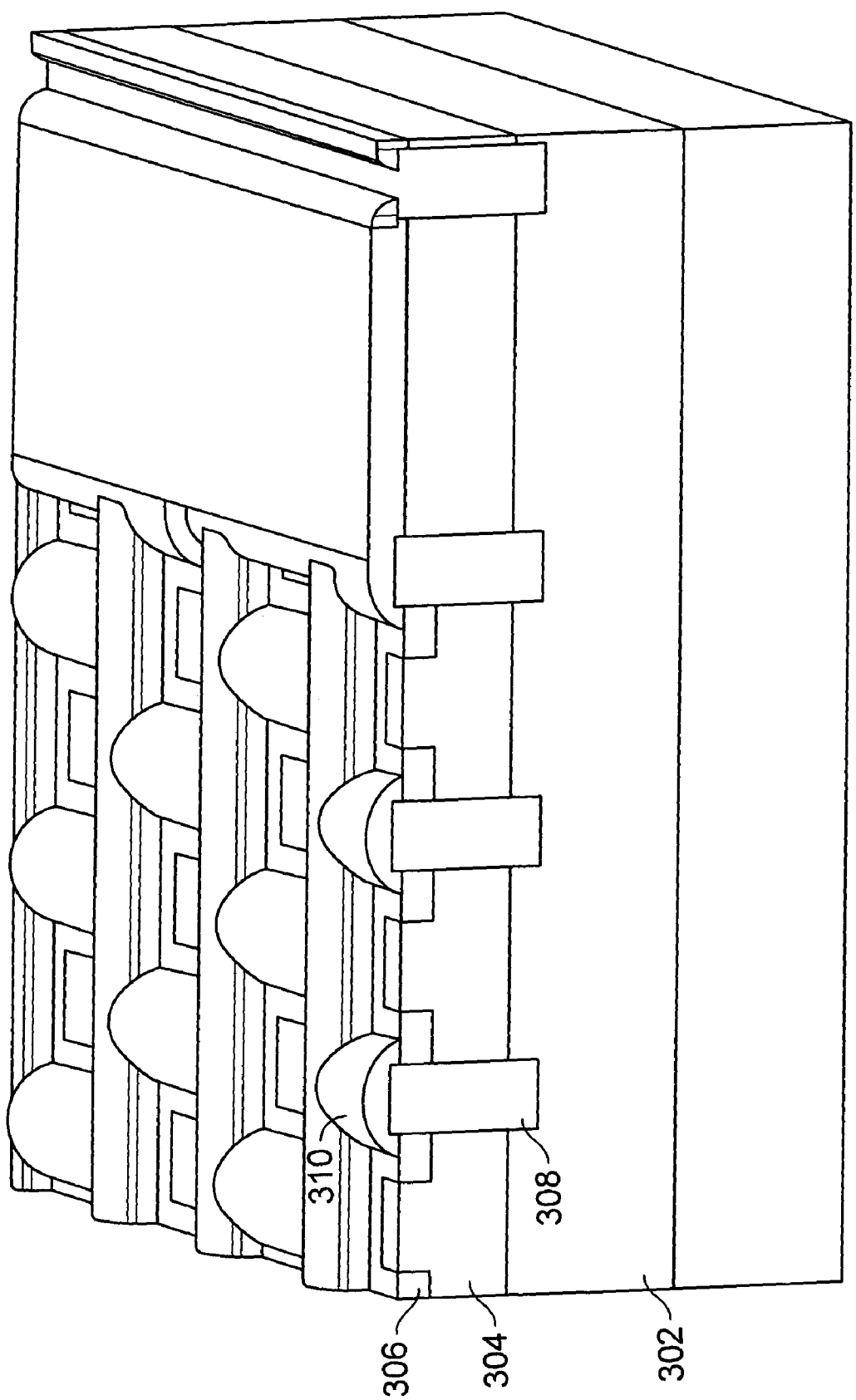
FIG. 3 is a perspective view of a power MOSFET device embodiment.

FIG. 3 is a perspective view of a power MOSFET device embodiment. In this example, device 300 includes a drain 302 formed on a semiconductor substrate, a body 304, a source 306 that is embedded in the body and extends downward from the top surface of the body into the body. For the purpose of example, N-channel devices with source and drain made of N-type material and body made of P-type material are discussed in detail throughout this specification. The techniques and structures disclosed herein are also applicable to P-channel devices. Device 300 also includes a gate 308 made of conductive material such as polycrystalline silicon (poly) that is disposed in a trench that extends through the source and the body to the drain. The top surface of gate 308 extends substantially above the top surface of source 306. By extending the gate through the source, the gate overlaps the bottom of the source even when the source depth changes. A dielectric material layer 310 is disposed over the gate to insulate the gate from source-body contact. Appropriate dielectric material includes thermal oxide, low temperature oxide (LTO), boro-phospho-silicate glass (BPSG), etc. A metal layer (not shown) is disposed on the device to form contact with the source and the gate.

Figure 4A:
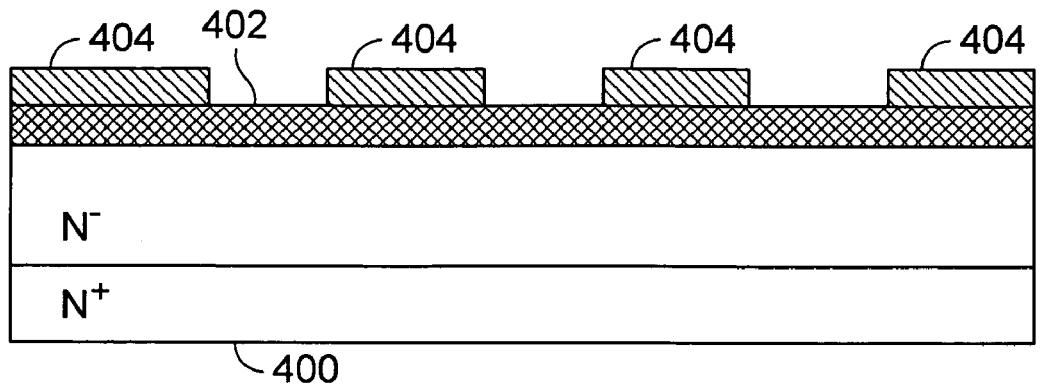
FIGS. 4A-4K are device cross-sectional views illustrating an example fabrication process used for fabricating device 300 of FIG. 3, according to some embodiments.

FIGS. 4A-4J are device cross-sectional views illustrating an example fabrication process used for fabricating device 300 of FIG. 3, according to some embodiments. In this example, an N type substrate 400 (i.e., an $N^+$ silicon wafer with an $N^-$ Epi layer grown on it) is used as the drain of the device. In FIG. 4A, a $SiO_2$ layer 402 is formed on the Epi wafer (substrate) by deposition or thermal oxidation. The thickness of the silicon oxide ranges from 500 Å to 30000 Å in some embodiments. Other thicknesses are used in other embodiments. The thickness is adjusted depending on the desired height of the gate. A photoresist layer 404 is spun on top of the oxide layer and patterned using a trench mask.

Figure 4B:
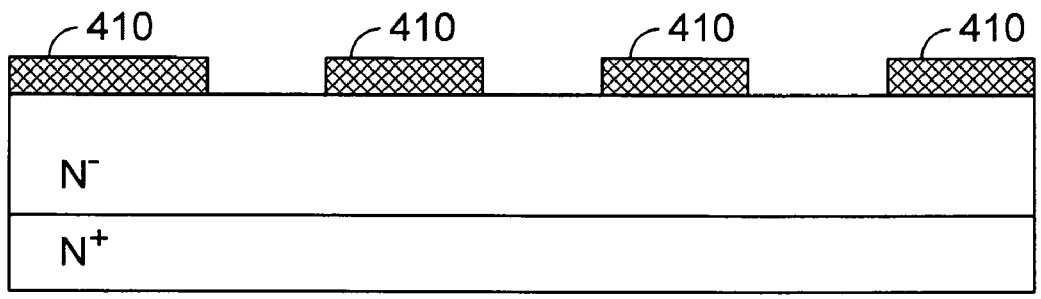
Figure 4C:
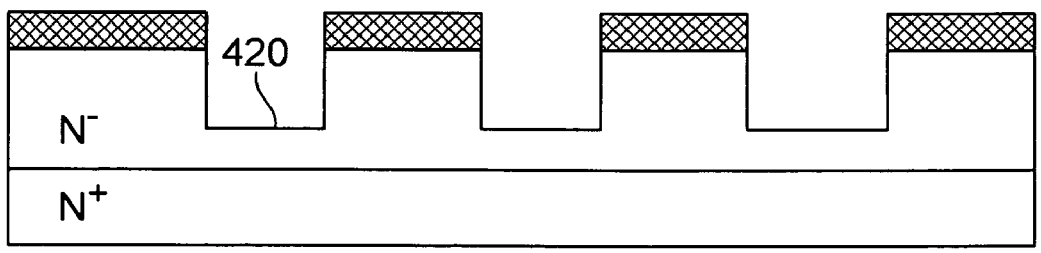
Figure 4D:
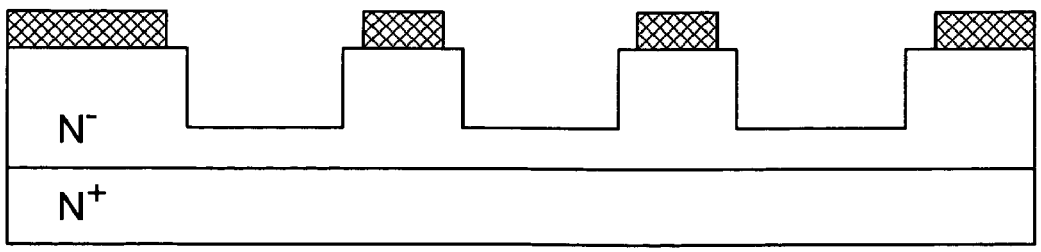

In FIG. 4B, the $SiO_2$ in the exposed areas is removed, leaving a $SiO_2$ hard mask 410 for silicon etching. In FIG. 4C, the silicon is etched anisotropically, leaving trenches such as 420. The gate material will be deposited in the trenches. It is preferable for the trench walls to be mutually aligned with respect to the hard mask, that is, the hard mask is used to determine the alignment of the trench walls so that they are aligned with each other. The gate that is later formed within the trench will have sides that are substantially perpendicular to the top surface of the substrate. In FIG. 4D, the $SiO_2$ hard mask is etched back by an appropriate amount so that the trench walls will remain approximately aligned with the edge of the hard mask after later etching steps. Although other types of material may be used, $SiO_2$ is the preferred mask material in this case because etching using $SiO_2$ hard mask leaves relatively straight trench walls that mutually align with the sides of the mask. Certain other types of material traditionally used for etching, such as $Si_3N_4$, may leave the etched trench walls with a curvature that is undesirable for gate formation in the following steps.

Figure 4E:
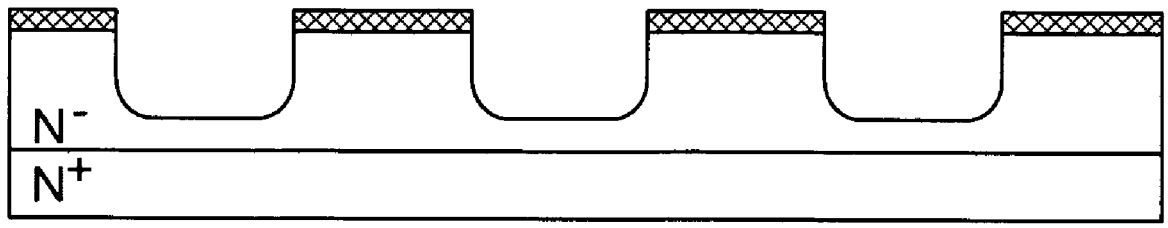
Figure 4F:
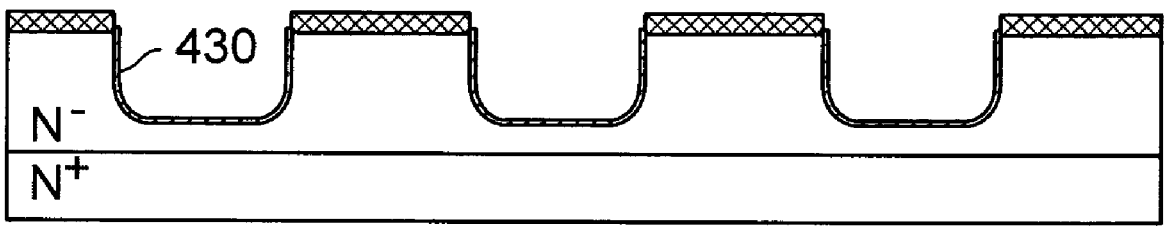
Figure 4G:
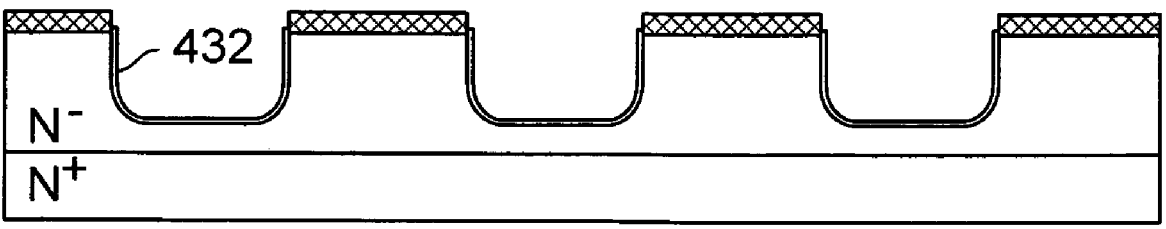

In FIG. 4E, the substrate is etched isotropically to round out the bottoms of the trenches. The trench is approximately between 0.5-2.5 μm deep and approximately between 0.2-1.5 μm wide in some embodiments, although other dimensions can be used in other embodiments. To provide a smooth surface for growing gate dielectric material, a sacrificial layer of $SiO_2$ 430 is grown in the trenches. This layer is then removed by the process of wet etching, also known as dipping. In FIG. 4G, a layer of $SiO_2$ 432 is grown thermally in the trenches as dielectric material.

Figure 4H:
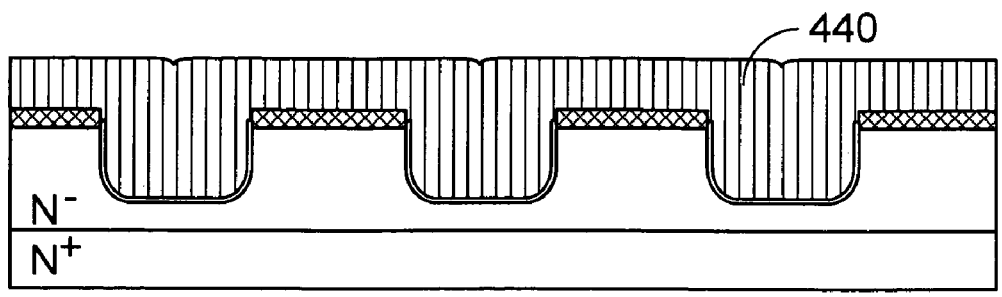
Figure 4I:
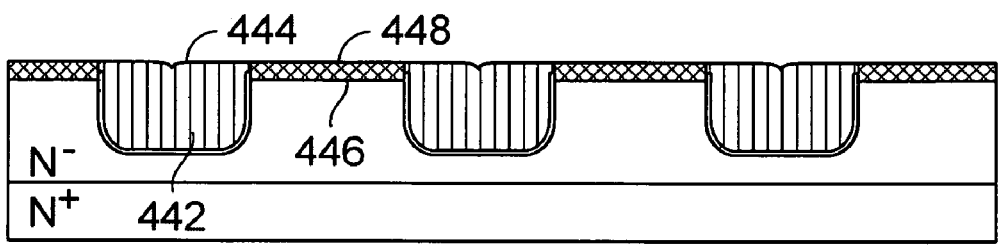
Figure 4J:
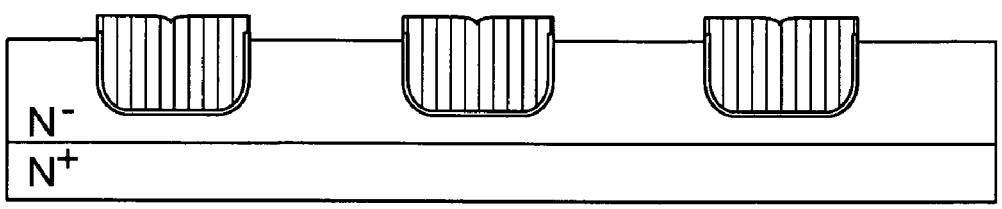

In FIG. 4H, poly 440 is deposited to fill up the trenches. To obtain the appropriate gate resistance, the poly is doped. In some embodiments, doping takes place as the poly layer is deposited (in situ). In some embodiments, the poly is doped after the deposition. In FIG. 4I, the poly layer on top of the $SiO_2$ is etched back to form gates such as 442. At this point, top surface 444 of the gate is still recessed relative to top surface 448 of the $SiO_2$; however, top surface 444 of the gate is still higher than top layer 446 of the silicon. In some embodiments, no mask is used in poly etch back. In some embodiments, a mask is used in poly etch back to eliminate the use of an additional mask in the following body implanting process. In FIG. 4J, the $SiO_2$ hard mask is removed. In some embodiments, dry etch is used for hard mask removal. The etching process stops when the top silicon surface is encountered, leaving the poly gate extending beyond the substrate surface where source and body dopants will be implanted. In some embodiments, the gate extends beyond the substrate surface by approximately between 300 Å to 20000 Å. A $SiO_2$ hard mask is preferably used in these embodiments since it provides the desired amount of gate extension beyond the substrate surface in a controllable fashion.

Figure 4K:
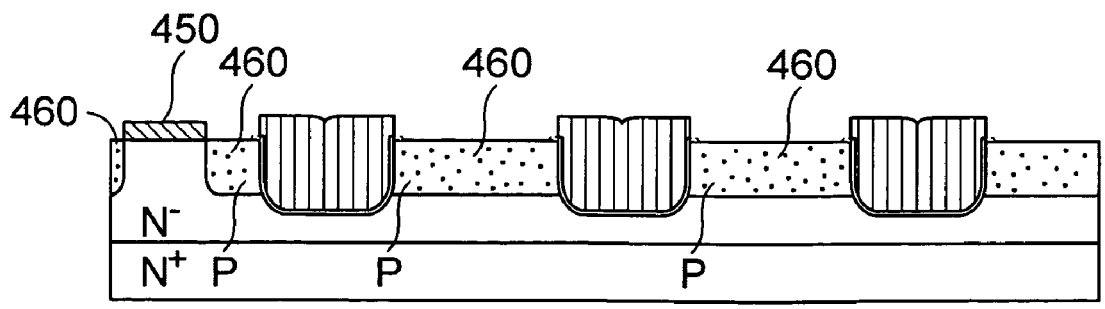

In FIG. 4K, a photoresist layer 450 is patterned on the body surface using a body mask. The unmasked regions are implanted with body dopant. Dopant material such as boron ions can be implanted by methods such as bombarding the substrate surface with the dopant material. The photoresist is then removed and the wafer is heated to thermally diffuse the implanted dopant via a process sometimes referred to as body drive. Body regions 460 are then formed. In some embodiments, the energy used for implanting the body dopant is approximately between 30-200 Kev, the dose is approximately between 5E12-4E13 ions/$cm^2$, and the resulting body depth is approximately between 0.3-2.4 μm, although other depths can be achieved by varying factors including the implant energy and dose. In some embodiments, mask is not used in body implantation.

Figure 5A:
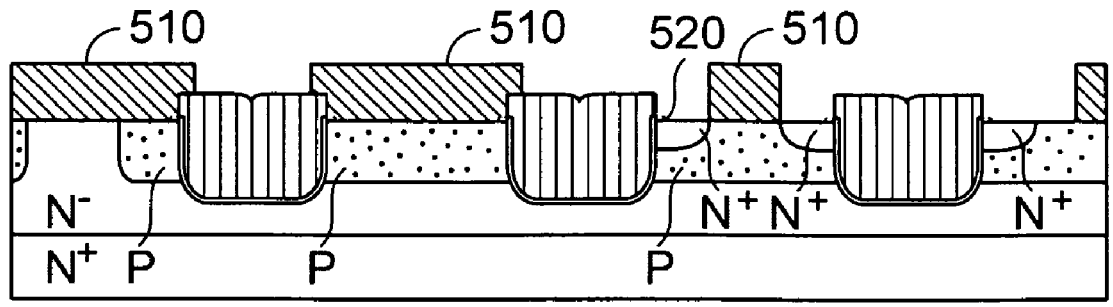
FIGS. 5A-5F are device cross-sectional views illustrating another example process used for fabricating device 300 of FIG. 3 following the process illustrated in FIGS. 4A-4K.

FIGS. 5A-5F are device cross-sectional views illustrating another example process used for fabricating device 300 of FIG. 3 following the process illustrated in FIGS. 4A-4K. In FIG. 5A, a layer of photoresist 510 is patterned using a source mask. The exposed areas of the body, such as 520, are implanted with source dopant. In some embodiments, the areas are bombarded with phosphorous ions to form $N^+$ type source. A source drive process may be applied by thermally diffusing the implanted dopant after the photoresist layer has been removed. In some embodiments, the energy used for implanting the body dopant is approximately between 5-80 Kev, the dose is approximately between 1E15-1E16 ions/$cm^2$, and the resulting source depth is approximately between 0.05-0.5 μm. Further depth reduction can be achieved by varying factors such as the doping energy and dose.

Figure 5B:
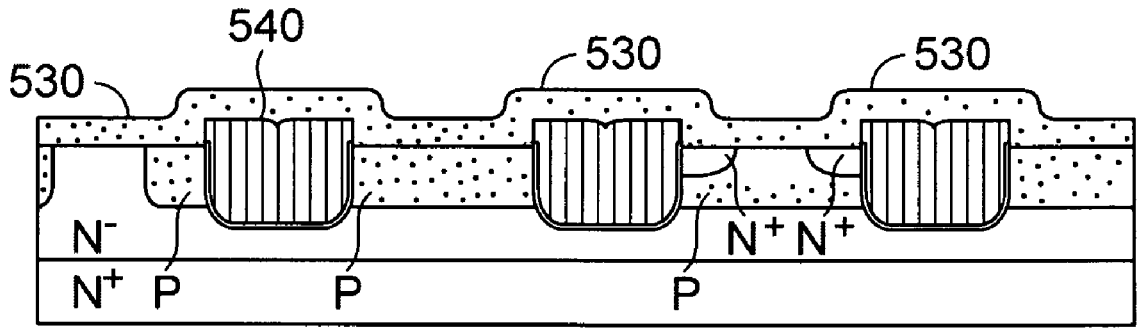
Figure 5C:
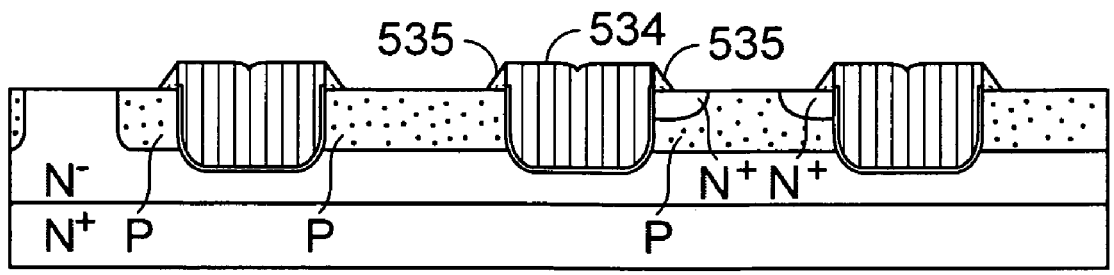
Figure 5D:
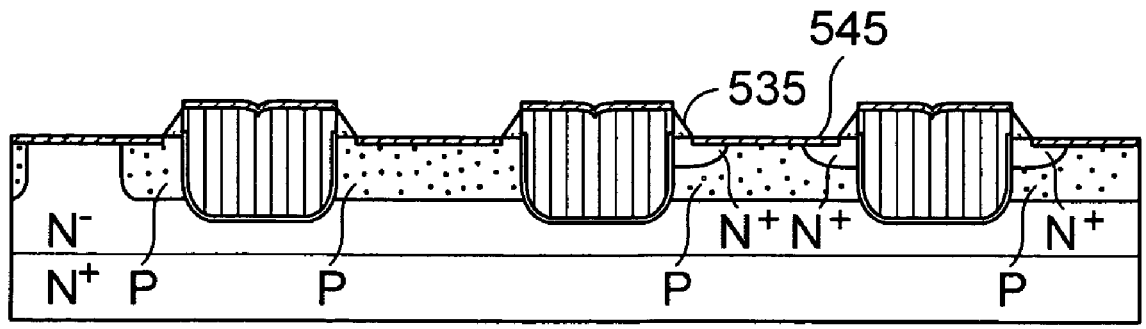

In FIG. 5B, a layer of dielectric material 530 is disposed on the surface of the structure. In FIG. 5C, the dielectric layer is then etched without mask, leaving a pair of spacer 535 around extruded gate 537. In FIG. 5D, Ti is deposited onto the surface and then heated to facilitate the formation of silicide where Ti is in contact with silicon or poly. Two source regions in the same body region are connected by a thin layer of Ti silicide 545, which is a good conductor. Spacers 535 effectively insulate the source from the gate. After the excess metal and the TiN formed during silicidation process are selectively etched, another layer of dielectric material such as BPSG is deposited.

Figure 5E:
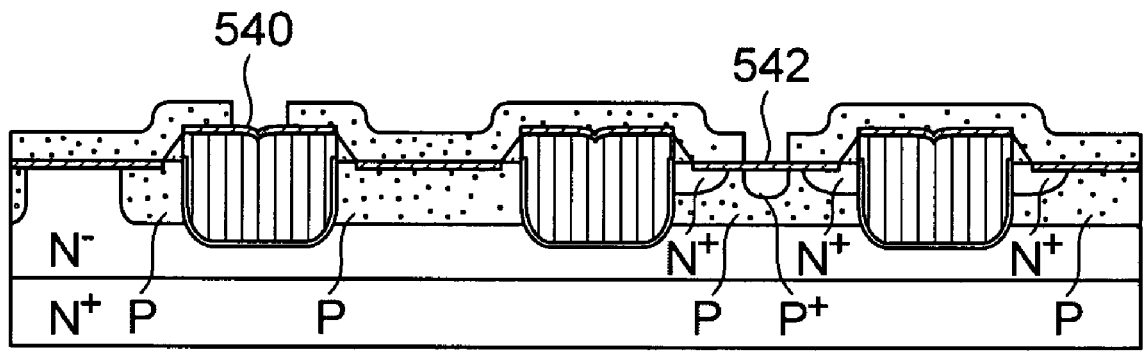
Figure 5F:
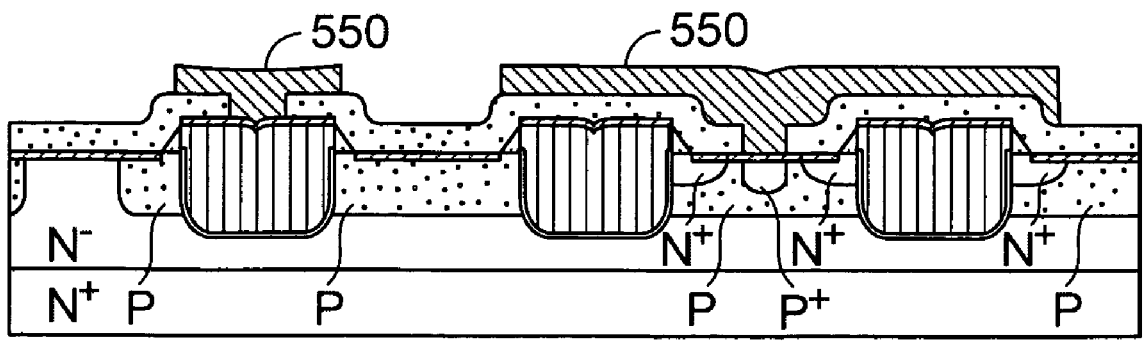

In FIG. 5E, a contact mask is used to pattern the contact openings such as 540 and 542. Contact openings on the body such as region 542 are implanted with Boron ion or BF2 ion to form a $P^+$-type region used to form an ohmic contact region. Metal 550 is deposited over the wafer and patterned to fill the contact openings, as shown in FIG. 5F. Thus, using the process shown in FIGS. 4A-4K followed by the process shown in FIGS. 5A-5F, a shallow source MOSFET device similar to device 300 of FIG. 3 can be fabricated.

The salicide process described in the embodiment above provides a self-aligned silicide contact because of the gate extrusion over the source surface. Since the gate extrusion can be accurately controlled, the spacers formed during the blanket etch process automatically provide a precision alignment for the contact. Tolerance margin is not necessary for the contact mask since the gate extrusion over the source surface can be accurately controlled. Smaller contact openings can be used. The resulting cell size and device on resistance are both reduced. In addition, the silicide on the top of the gate also improves the resistance of poly gate since silicide is a better conductor. Improvement in gate resistance becomes important when cell density increases and gate size becomes narrow.

Figure 6A:
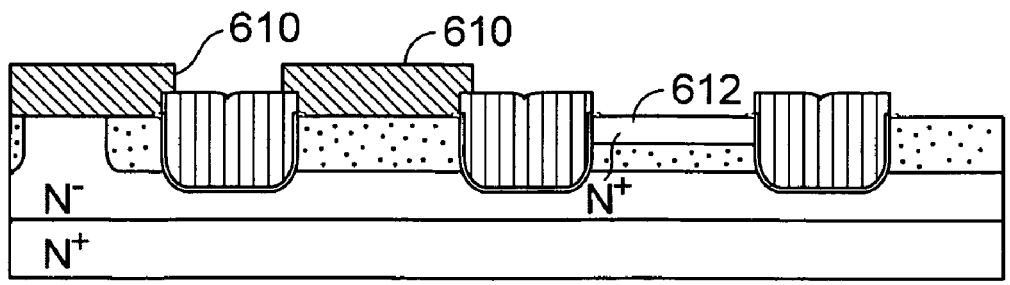
FIGS. 6A-6D are device cross-sectional views illustrating another example process used for fabricating device 300 of FIG. 3 following the process illustrated in FIGS. 4A-4K.
Figure 6B:
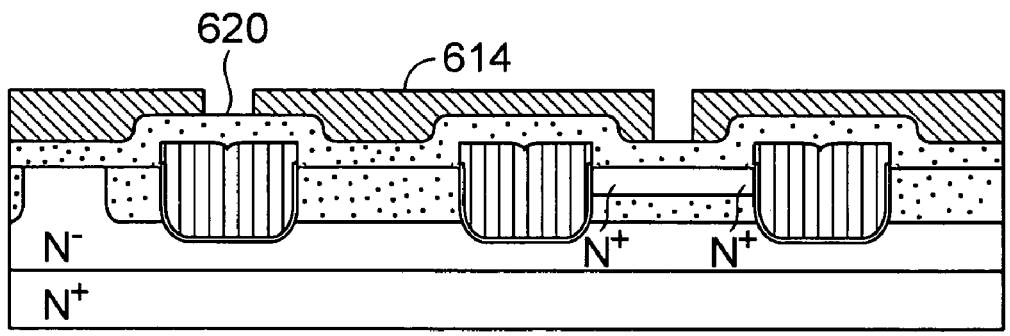
Figure 6C:
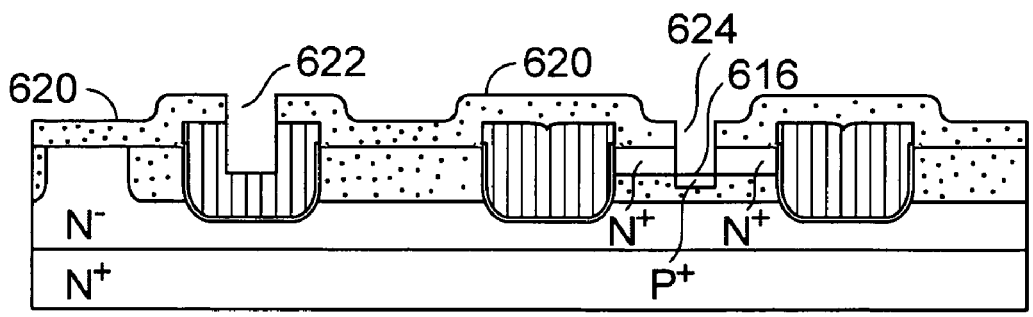
Figure 6D:
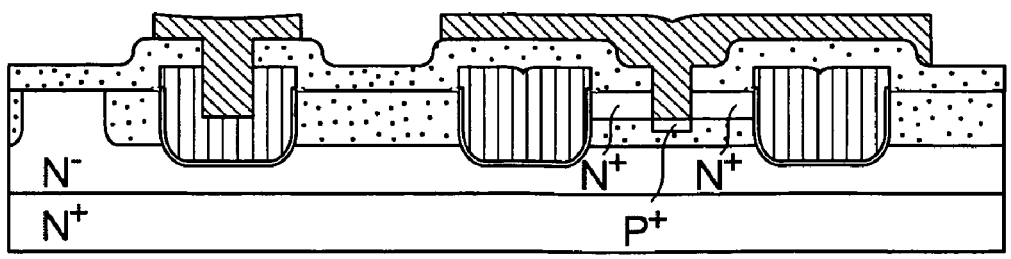

FIGS. 6A-6D are device cross-sectional views illustrating another example process used for fabricating device 300 of FIG. 3 following the process illustrated in FIGS. 4A-4K. In FIG. 6A, a photoresist layer 610 is patterned to allow source dopant to be implanted in region 612. In FIG. 6B, dielectric (e.g. BPSG) layer 620 is disposed on the top surface of the device after source drive in. An etch mask 614 is then formed. In FIG. 6C, contact openings such as 622 and 624 are made, and a section of the source implant is etched away. Using the same etch mask, B or $BF_2$ ions are implanted in region 616 for making ohmic contact. In FIG. 6D, metal such as aluminum, combination of Ti/TiN/Al—Cu alloy or combination of Ti/TiN/W/Al alloy is disposed to form contact. A mask etch separates the gate metal contact from the source-body contact.

In the process shown above, the gate is formed prior to the source and/or the body so that the high temperature used in gate formation does not drive the source deeper or increase the required depth of the trench and the gate. In some embodiments, the body or the source or both are formed before the gate is formed.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of fabricating a semiconductor device, comprising:

forming a hard mask on a substrate having a top substrate surface;

forming a trench in the substrate, through the hard mask;

depositing gate material in the trench, where the amount of gate material deposited in the trench extends beyond the top substrate surface; and removing the hard mask to leave a gate having a gate top surface that extends substantially above the top substrate surface at least in center region of the trench opening, the gate having a vertical edge that includes an extended portion, the extended portion extending above the trench opening and being substantially aligned with the trench wall;

implanting a body;

implanting a plurality of source regions embedded in the body;

forming a plurality of spacers that insulate the source regions from the gate, the plurality of spacers being situated immediately adjacent to the gate and immediately adjacent to respective ones of the plurality of source regions, wherein the plurality of spacers do not substantially extend into the trench and do not substantially extend over the trench;

disposing a dielectric layer over the source, the spacers, the gate, and at least a portion of the body;

forming a contact opening; and disposing metal to form a contact with the body at the contact opening.

2. The method of claim 1, wherein the hard mask is a $SiO_2$ hard mask.

3. The method of claim 1, wherein the trench is formed to be mutually aligned with the hard mask.

4. The method of claim 1, wherein forming the contact opening includes patterning the dielectric layer.

5. The method of claim 4, further comprising forming an ohmic contact region in the body in the contact opening.

6. The method of claim 1, wherein forming the contact opening includes patterning the dielectric layer and etching the contact opening through the source.

7. The method of claim 6, further comprising implanting an ohmic contact in the body in the contact opening.

8. The method of claim 1, wherein forming the plurality of spacers includes disposing a layer of dielectric material, and etching the layer of dielectric material without a mask.

9. The method of claim 1, further comprising forming a silicide layer.

10. The method of claim 1, wherein formation of the contact opening is self-aligned.

* * * * *